(12) United States Patent
Lee et al.

(10) Patent No.: US 12,295,249 B2
(45) Date of Patent: May 6, 2025

(54) DISPLAY DEVICE AND METHOD OF PROVIDING THE SAME

(71) Applicant: Samsung Display Co., Ltd., Yongin-si (KR)

(72) Inventors: Heeyoung Lee, Hwaseong-si (KR); Jin Yong Sim, Seongnam-si (KR); Sungyeon Cho, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 459 days.

(21) Appl. No.: 17/878,189

(22) Filed: Aug. 1, 2022

(65) Prior Publication Data

US 2023/0127915 A1 Apr. 27, 2023

(30) Foreign Application Priority Data

Oct. 21, 2021 (KR) ................. 10-2021-0141022

(51) Int. Cl.
*B32B 3/08* (2006.01)
*B32B 3/26* (2006.01)
(Continued)

(52) U.S. Cl.
CPC .............. *H10K 77/111* (2023.02); *B32B 3/08* (2013.01); *B32B 3/266* (2013.01); *B32B 7/12* (2013.01); *B32B 15/04* (2013.01); *H10K 71/00* (2023.02); *H10K 71/50* (2023.02); *B32B 23/04* (2013.01); *B32B 27/281* (2013.01); *B32B 27/283* (2013.01); *B32B 27/308* (2013.01); *B32B 27/34* (2013.01); *B32B 27/38* (2013.01); *B32B 27/40* (2013.01); *B32B 2255/06* (2013.01); *B32B 2255/26* (2013.01); *B32B 2255/28* (2013.01); *B32B 2264/301* (2020.08); *B32B 2307/206* (2013.01); *B32B 2307/402* (2013.01); *B32B 2307/538* (2013.01); *B32B 2307/54* (2013.01);
(Continued)

(58) Field of Classification Search
CPC .. B32B 3/02; B32B 3/08; B32B 3/085; B32B 3/10; B32B 3/18; B32B 3/22; B32B 7/12
See application file for complete search history.

(56) References Cited

U.S. PATENT DOCUMENTS 11,073,863 B2 7/2021 Kim et al.
11,178,779 B2 11/2021 Sim et al.
(Continued)

FOREIGN PATENT DOCUMENTS

EP 3865971 A1 8/2021
KR 1020190077136 A 7/2019
(Continued)

OTHER PUBLICATIONS

KR 20210005412 (Year: 2021).*

*Primary Examiner* — Elizabeth E Mulvaney
(74) *Attorney, Agent, or Firm* — CANTOR COLBURN LLP

(57) ABSTRACT

A display device includes a display panel including a folding area and a non-folding area which is adjacent to the folding area, a support member facing the folding area and the non-folding area of the display panel and having a total planar area, and a light shielding layer between the display panel and the support member and having a total planar area which is smaller than the total planar area of the support member.

20 Claims, 10 Drawing Sheets

(51) Int. Cl.
  *B32B 7/12* (2006.01)
  *B32B 15/04* (2006.01)
  *H10K 71/00* (2023.01)
  *H10K 71/50* (2023.01)
  *H10K 77/10* (2023.01)
  *B32B 23/04* (2006.01)
  *B32B 27/28* (2006.01)
  *B32B 27/30* (2006.01)
  *B32B 27/34* (2006.01)
  *B32B 27/38* (2006.01)
  *B32B 27/40* (2006.01)
  *H10K 102/00* (2023.01)

(52) U.S. Cl.
  CPC . *B32B 2307/546* (2013.01); *B32B 2307/7244* (2013.01); *B32B 2307/7246* (2013.01); *B32B 2307/748* (2013.01); *B32B 2457/206* (2013.01); *H10K 2102/311* (2023.02)

(56) References Cited

U.S. PATENT DOCUMENTS

| | | |
|---|---|---|
| 2019/0198586 A1 | 6/2019 | Kim |
| 2020/0375046 A1 | 11/2020 | Sim et al. |
| 2020/0383217 A1 | 12/2020 | Kim et al. |
| 2021/0119171 A1 | 4/2021 | Kim et al. |
| 2021/0120687 A1 | 4/2021 | Kim et al. |
| 2021/0259093 A1 | 8/2021 | Park |
| 2022/0114923 A1* | 4/2022 | Ha ................ G06F 1/1652 |
| 2022/0418118 A1* | 12/2022 | Sim ................ G06F 1/1681 |
| 2023/0099774 A1* | 3/2023 | Gook ............... G02B 5/3033 |
| | | 359/350 |

FOREIGN PATENT DOCUMENTS

| | | |
|---|---|---|
| KR | 1020200135636 A | 12/2020 |
| KR | 1020200139292 A | 12/2020 |
| KR | 1020210012090 A | 2/2021 |
| KR | 1020210047389 A | 4/2021 |
| KR | 1020210048022 A | 5/2021 |
| KR | 1020210050040 A | 5/2021 |

* cited by examiner

DISPLAY DEVICE AND METHOD OF PROVIDING THE SAME

This application claims priority to Korean Patent Application No. 10-2021-0141022, filed on Oct. 21, 2021, and all the benefits accruing therefrom under 35 U.S.C. § 119, the entire contents of which are hereby incorporated by reference.

BACKGROUND

(1) Field

The present disclosure herein relates to a display device and a method of providing the same. More particularly, the present disclosure relates to a foldable display device and a method of providing the same.

(2) Description of the Related Art

A display device includes an active area that is activated by an electrical signal. The display device may sense an input applied from the outside through the active area and simultaneously display various images to provide information to outside of the display device.

As display devices having various shapes are developed, active areas having various shapes are being realized.

SUMMARY

The present disclosure provides a display device capable of enhancing visibility and effectively removing effects of static electricity applied from outside the display device, and a method of providing the display device.

An embodiment provides a display device includes a display panel including a first non-folding area, a folding area and a second non-folding area arranged in a first direction, a support member below the display panel, and a light shielding layer on the support member and containing a light shielding material. The light shielding layer has a total planar area less than a total planar area of the support member, on a plane defined by the first direction and a second direction which crosses the first direction.

In an embodiment, the support member may include a first area which is non-overlapping the light shielding layer on the plane, and a second area which is overlapping the light shielding layer on the plane.

In an embodiment, the first area may not overlap the display panel on the plane.

In an embodiment, the support member may have a long side extending in the first direction, a short side extending in the second direction, and a corner at which the long side and the short side meet. The first area may correspond to the corner.

In an embodiment, the light shielding layer may include chrome carbide (CrC).

In an embodiment, the light shielding layer may include a black dye or a black pigment.

In an embodiment, a solid content contained in the light shielding layer may have a mean particle size of about 0.05 micrometer ($\mu$m) or less.

In an embodiment, the light shielding layer may be directly on the support member.

In an embodiment, the display device may further include a light shielding adhesive layer between the light shielding layer and the support member, and the light shielding adhesive layer may contact each of a bottom surface of the light shielding layer and a top surface of the support member.

In an embodiment, the support member may include metal.

In an embodiment, the support member may include a first plate non-folding part corresponding to the first non-folding area, a plate folding part corresponding to the folding area, a second plate non-folding part corresponding to the second non-folding area, and a plurality of openings defined in the plate folding part.

In an embodiment, a plurality of light shielding openings respectively corresponding to the plurality of openings may be defined in the light shielding layer.

In an embodiment, the display device may further include a lower protection film below the display panel, and an additional adhesive layer between the light shielding layer and the lower protection film. The additional adhesive layer may contact each of a bottom surface of the lower protection film and a top surface of the light shielding layer.

In an embodiment, a surface adhesive force of the light shielding layer relative to the additional adhesive layer may be about 800 gram force per inch (gf/inch) or more.

In an embodiment, the light shielding layer may have an arithmetic mean roughness of about 0.5 $\mu$m or less.

In an embodiment, a display device includes a display panel, a support member below the display panel, and a light shielding layer on the support member and containing a light shielding material. The support member includes a first area non-overlapping the light shielding layer on a plane defined by a first direction and a second direction which crosses the first direction, and a second area overlapping the light shielding layer on the plane.

An embodiment provides a method for manufacturing or providing a display device including a display panel and a support member which is below the display panel, includes manufacturing the support member, and attaching the manufactured support member to a lower portion of the display panel. Here, the manufacturing of the support member includes forming or providing a light shielding layer by applying paint containing a light shielding material onto the support member, where the light shielding layer is non-overlapping with a first area of the support member and overlapping a second area of the support member.

In an embodiment, the method may further include providing a mask in which a first opening is defined, onto the support member, and the first opening may overlap the second area.

In an embodiment, the mask may include a blocking part which overlaps the first area.

In an embodiment, the support member may include a first plate non-folding part, a plate folding part and a second plate non-folding part arranged in the first direction, a plurality of openings may be defined in the plate folding part, and in the forming of the light shielding layer, the paint may be applied to an area except for an area overlapping the plurality of openings of the plate folding part.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
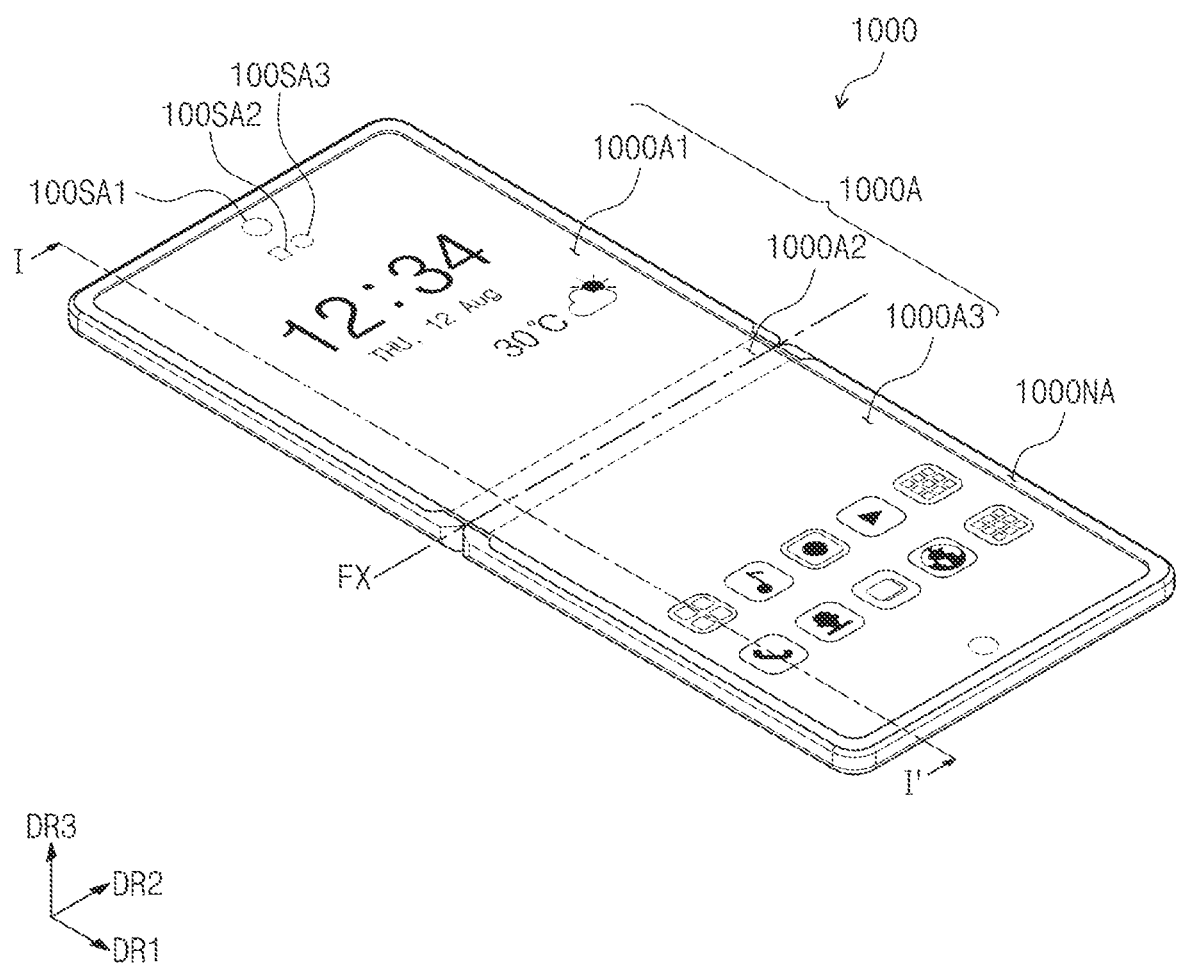
FIG. 1A is a perspective view illustrating a display device according to an embodiment.

Hereinafter, embodiments of the invention will be described with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. Also, in the figures, the dimensions of components are exaggerated for clarity of illustration. As used herein, a reference number may indicate a singular element or a plurality of the element. For example, a reference number labeling a singular form of an element within the drawing figures may be used to reference a plurality of the singular element within the text of specification.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term and/or includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment.

Also, spatially relative terms, such as "below", "lower", "above", and "upper", may be used herein for ease of description to describe an element and/or a feature's relationship to another element(s) and/or feature(s) as illustrated in the drawings. The terms are relative concepts and described with respect to the direction indicated in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

In this application, it will be understood that when a layer, a film, a region, or a plate is "directly contact" another layer, film, region, or plate, further another layer, film, region, or plate is not be present therebetween. It will also be understood that when an element or layer is referred to as being 'on' another one, it can be directly on the other one, or one or more intervening elements or layers may also be present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
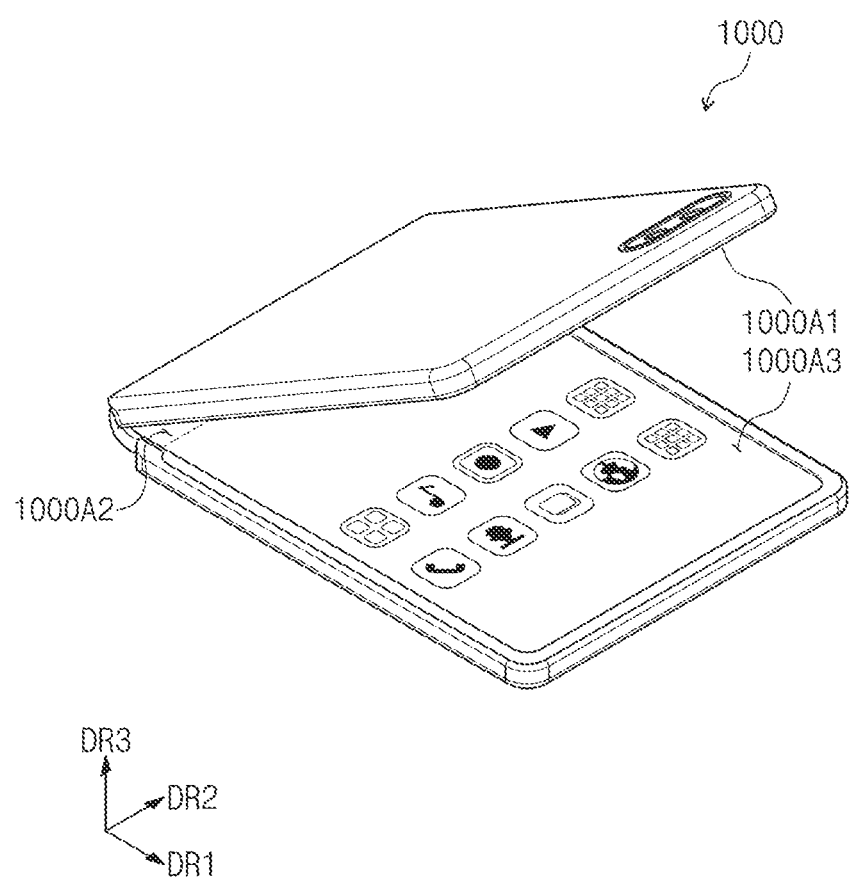
FIG. 1B is a perspective view illustrating the display device according to an embodiment.

FIG. 1A is a perspective view of a display device 1000 which is unfolded, according to an embodiment. FIG. 1B is a perspective view of the display device 1000 which is folded, according to an embodiment. FIG. 1A illustrates an unfolded state of a display device 1000, and FIG. 1B illustrates a folded state of the display device 1000.

Referring to FIGS. 1A and 1B, the display device 1000 may be activated by an electrical signal. Although the display device 1000 may be an electronic apparatus such as a mobile phone, a tablet computer, a navigation unit for a vehicle, a game console, or a wearable device as an example, the invention is not limited thereto. FIG. 1A illustrates a mobile phone as an example of the display device 1000.

The display device 1000 may display an image through an active area 1000A. The active area 1000A may include or in a plane defined by a first direction DR1 and a second direction DR2 crossing each other in the unfolded state of the display device 1000. The display device 1000 may have a thickness direction parallel to a third direction DR3 crossing the first direction DR1 and the second direction DR2. Thus, a front surface (or a top surface) and a rear surface (or a bottom surface) of members constituting the display device 1000 may be defined with respect to the third direction DR3.

The active area 1000A may include a first area 1000A1, a second area 1000A2, and a third area 1000A3. The display device 1000 may be bendable at the second area 1000A2, and may be bent around a folding axis FX extending in the second direction DR2. Thus, in this specification, a non-folding area providing in plural may include the first area 1000A1 and the third area 1000A3 as non-folding areas, and the second area 1000A2 may be referred to as a folding area. More specifically, the first area 1000A1 may be referred to as a first non-folding area, the second area 1000A2 may be referred to as a folding area, and the third area 1000A3 may be referred to as a second non-folding area. The display device 1000 and various components or layers thereof may include a non-folding area and a folding area corresponding to those described above. That is, the display device 1000 and various components or layers thereof may be foldable together with each other at the folding area.

When the display device 1000 is folded, the first area 1000A1 and the third area 1000A3 may face each other. Thus, the active area 1000A may not be exposed to the outside in a completely folded state of the display device 1000, and this may be referred to as in-folding. However, this is merely illustrative, and the invention is not limited to the operation of the display device 1000.

In an embodiment, when the display device 1000 is folded, the first area 1000A1 and the third area 1000A3 may be opposed to each other such as to face in opposite directions from each other. Thus, in the folded state of the display device 1000, the active area 1000A may be exposed to the outside, and this may be referred to as out-folding.

The display device 1000 may perform only one of the in-folding operation or the out-folding operation. Alternatively, the display device 1000 may perform all of the in-folding operation or the out-folding operation. In this case, the same area of the display device 1000, e.g., the second area 1000A2, may be foldable so as to be in-folded and out-folded. Alternatively, one area of the display device 1000 may be in-folded, and another area thereof may be out-folded.

Although one folding area and two non-folding areas are illustrated as an example in FIGS. 1A and 1B, the invention is not limited to the number of each of the folding area and the non-folding area. In an embodiment, for example, the display device 1000 may include two or more plurality of non-folding areas, and a plurality of folding areas disposed respectively between the non-folding areas that are adjacent to each other.

Although the folding axis FX is parallel to a minor axis of the display device 1000 as an example in FIGS. 1A and 1B, the invention is not limited thereto. In an embodiment, for example, the folding axis FX may extend in parallel to a major axis of the display device 1000, e.g., the first direction DR1. In this case, the first area 1000A1, the second area 1000A2, and the third area 1000A3 may be sequentially arranged in order along the second direction DR2.

A plurality of sensing areas 100SA1, 100SA2, and 100SA3 may be defined in the display device 1000. Although three sensing areas 100SA1, 100SA2, and 100SA3 are illustrated as an example in FIG. 1A, the invention is not limited to the number of the sensing areas 100SA1, 100SA2, and 100SA3.

The plurality of sensing areas 100SA1, 100SA2, and 100SA3 may include a first sensing area 100SA1, a second sensing area 100SA2, and a third sensing area 100SA3. In an embodiment, for example, the first sensing area 100SA1 may overlap (or correspond to) a functional module which provides a function to the display device 1000 using an external input such as light, pressure, etc. such as a camera module, and each of the second sensing area 100SA2 and the third sensing area 100SA3 may overlap a function module such as a proximity illumination sensor. However, the invention is not limited thereto.

Each of a plurality of electronic modules may receive an external input transmitted through the first sensing area 100SA1, the second sensing area 100SA2, or the third sensing area 100SA3, or provide an output through the first sensing area 100SA1, the second sensing area 100SA2, or the third sensing area 100SA3.

The first sensing area 100SA1 may be surrounded by the active area 1000A, and each of the second and third sensing areas 100SA2 and 100SA3 may be contained in the active area 1000A. That is, each of the second and third sensing areas 100SA2 and 100SA3 may display an image as portions of a display area of the display device 1000. The first sensing area 100SA1 may be a portion of a non-display area of the display device 1000, without being limited thereto. Each of the first sensing area 100SA1, the second sensing area 100SA2, and the third sensing area 100SA3 may have a transmittance (e.g., light transmittance) greater than that of the active area 1000A. Also, the first sensing area 100SA1 may have a transmittance greater than that of each of the second and third sensing areas 100SA2 and 100SA3.

According to an embodiment, a portion of the plurality of electronic modules may overlap the active area 1000A, and the other portion of the plurality of electronic modules may be surrounded by the active area 1000A. Thus, an area (e.g., planar area) at which the plurality of electronic modules are disposed in a peripheral area 1000NA disposed around the active area 1000A is obviated. As a result, a ratio of the active area 1000A to a total planar area of a front surface of the display device 1000 may increase.

Figure 2:
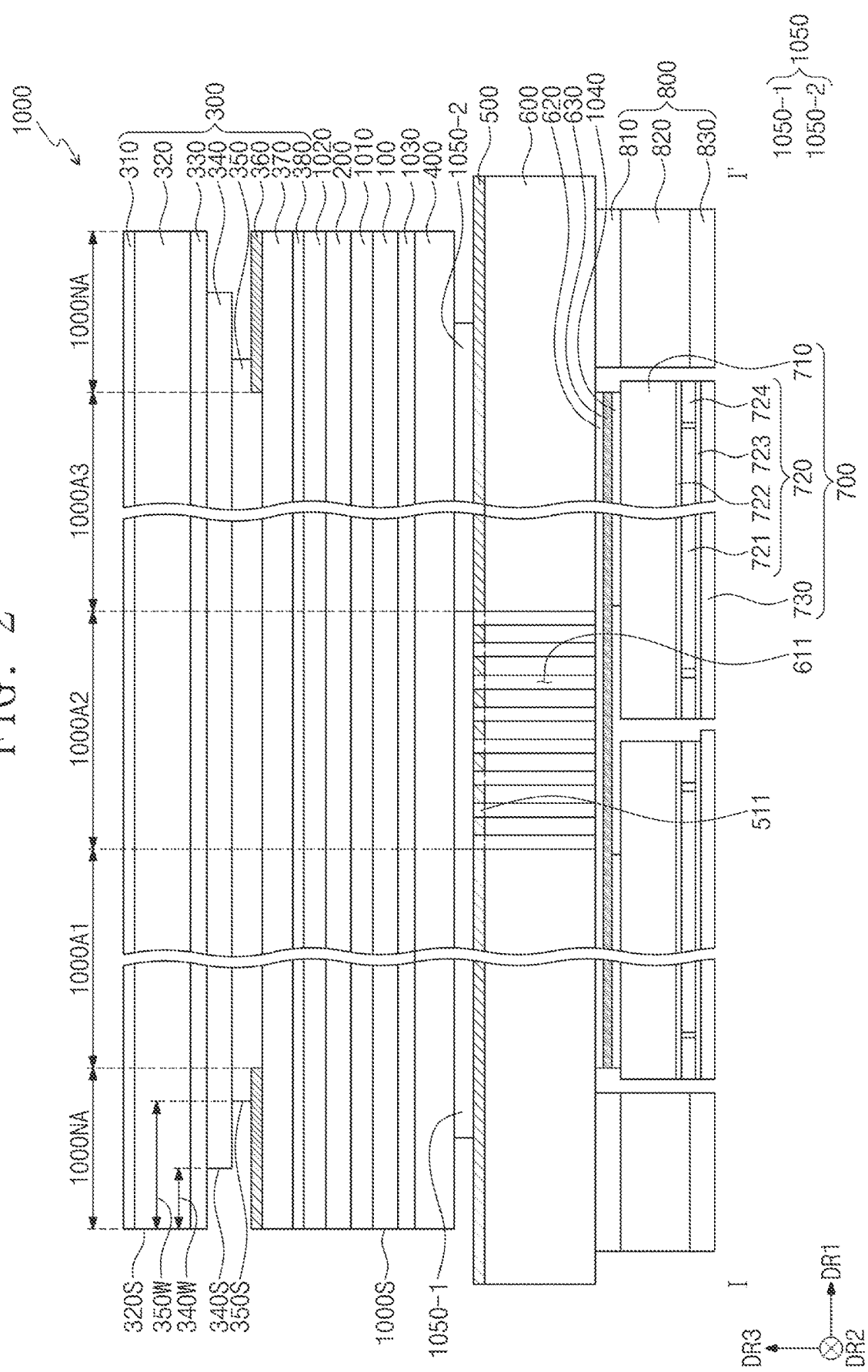
FIG. 2 is a cross-sectional view illustrating the display device according to an embodiment.
Figure 3:
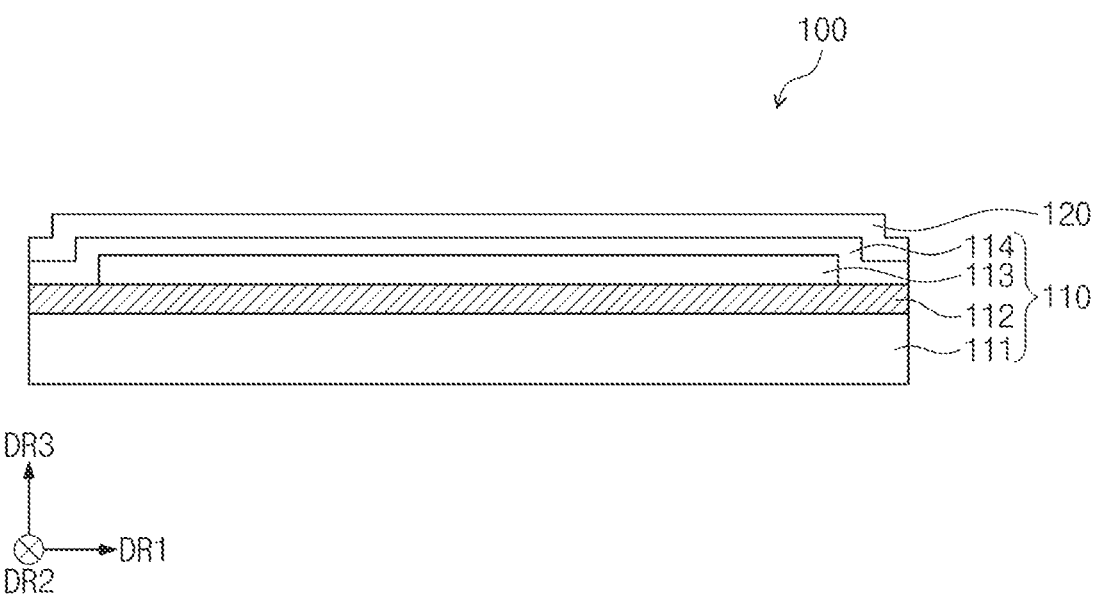
FIG. 3 is a cross-sectional view illustrating a display panel according to an embodiment.

FIG. 2 is a cross-sectional view of the display device 1000 according to an embodiment. FIG. 2 illustrates a cross-sectional view taken along line I-I' of FIG. 1A and illustrating the display device 1000. FIG. 3 is a cross-sectional view of a display panel 100 according to an embodiment.

Referring to FIG. 2, the display device 1000 may include a display panel 100, upper functional layers, and lower functional layers.

Referring to FIG. 3, the display panel 100 may generate an image and sense an input applied from outside the display panel 100 and/or the display device 1000. In an embodiment, for example, the display panel 100 may include a display layer 110 and a sensor layer 120. The display panel 100 may have a thickness of about 25 micrometers (μm) to about 35 μm, e.g., about 30 μm. However, the invention is not limited to the thickness of the display panel 100.

The display layer 110 may be a component or layer including various components that substantially generates an image. The display layer 110 may be a light emitting display layer such as, e.g., an organic light emitting display layer, a quantum dot display layer, or a micro-light emitting diode (LED) display layer.

The display layer 110 may include a base layer 111, a circuit layer 112, a light emitting element layer 113, and an encapsulation layer 114.

The base layer 111 may include a synthetic resin film. The synthetic resin layer may include a thermosetting resin. The base layer 111 may have a multi-layer structure.

In an embodiment, for example, the base layer 111 may have a three-layer structure of a synthetic resin layer, an adhesive layer, and a synthetic resin layer. Although the synthetic resin layer may be a polyimide-based resin layer, the invention is not limited to the material of the synthetic resin layer. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In addition, the base layer 111 may include a glass substrate or an organic/inorganic composite substrate.

The circuit layer 112 may be disposed on the base layer 111. The circuit layer 112 may include an insulation layer, a semiconductor pattern, a conductive pattern, and a signal line. The insulation layer, the semiconductor layer, and the conductive layer may be provided on the base layer 111 by a method such as coating and deposition, and then the insulation layer, the semiconductor layer, and the conductive layer may be selectively patterned through a plurality of photolithography processes. Thereafter, the semiconductor pattern, the conductive pattern, and the signal line, which are contained in the circuit layer 112, may be provided.

The light emitting element layer 113 may be disposed on the circuit layer 112. The light emitting element layer 113 may include a light emitting element. In an embodiment, for example, the light emitting element layer 113 may include an organic light emitting material, a quantum dot, a quantum rod, or a micro-LED.

The encapsulation layer 114 may be disposed on the light emitting element layer 113. Although the encapsulation layer 114 may include an inorganic layer, an organic layer, and an inorganic layer, which are sequentially laminated, the invention is not limited to the layers constituting the encapsulation layer 114.

The inorganic layers protect the light emitting element layer 113 from moisture and oxygen, and the organic layer protects the light emitting element layer 113 from foreign substances such as dust particles. The inorganic layers may include a silicon nitride layer, a silicon oxynitride layer, a silicon oxide layer, a titanium oxide layer, or an aluminum oxide layer. Although the organic layer may include an acrylic-based organic layer, the invention is not limited thereto.

The sensor layer 120 may be disposed on the display layer 110. The sensor layer 120 may sense an external input applied from outside. The external input may be an input such as light, heat, pressure, etc. from an input tool. In an embodiment, for example, the input tool may include various types of external inputs such as a portion of a user's body, a pen, etc.

The sensor layer 120 may be disposed on the display layer 110 through a continuous process. In this case, the sensor layer 120 may be directly disposed on the display layer 110. The expression of being "directly disposed" may represent that a third component is not disposed between the sensor layer 120 and the display layer 110. That is, an additional adhesive member may not be disposed between the sensor layer 120 and the display layer 110.

Alternatively, the sensor layer 120 may be coupled with the display layer 110 through an adhesive member. The adhesive member may include a typical adhesive or sticking agent.

Referring to FIG. 2 again, the upper functional layers may be disposed on the display panel 100. In an embodiment, for example, the upper functional layers may include an anti-reflection member 200 and an upper member 300.

The anti-reflection member 200 may be referred to as an anti-reflection layer. The anti-reflection member 200 may reduce a reflectance of external light incident from the outside. The anti-reflection member 200 may include an elongated synthetic resin film. In an embodiment, for example, the anti-reflection member 200 may be provided by dyeing an iodine compound to a polyvinyl alcohol film (a PVA film). However, this is merely illustrative, and the invention is not limited to the material of the anti-reflection member 200. The anti-reflection member 200 may have a thickness of about 25 μm to about 35 μm, e.g., about 31 μm. However, the invention is not limited to the thickness of the anti-reflection member 200.

The anti-reflection member 200 according to an embodiment may include color filters. The color filters may have an arrangement. The arrangement of the color filters may be determined in consideration of emission colors of the pixels contained in the display layer 110. Also, the anti-reflection layer may further include a black matrix pattern disposed adjacent to the color filters.

The anti-reflection member 200 according to an embodiment may include a destructive interference structure. In an embodiment, for example, the destructive interference structure may include a first reflection layer and a second reflection layer, which are disposed on different layers from each other. First reflected light and second reflected light, which are respectively reflected from the first reflection layer and the second reflection layer, may be destructively interfered with each other, and thus a reflectance of external light may decrease.

The anti-reflection member 200 may be coupled with the display panel 100 through a first adhesive layer 1010. The first adhesive layer 1010 may be a transparent adhesive layer such as a pressure sensitive adhesive film (PSA), an optically clear adhesive film (OCA), or an optically clear resin (OCR). Hereinafter, the adhesive layer may include a typical adhesive or sticking agent. The first adhesive layer 1010 may have a thickness of about 20 μm to about 30 μm, e.g., about 25 μm. However, the invention is not limited to the thickness of the first adhesive layer 1010.

In an embodiment, the first adhesive layer 1010 may be omitted, and in this case, the anti-reflection member 200 may be directly disposed on the display panel 100. In this case, an additional adhesive member may not be disposed between the anti-reflection member 200 and the display panel 100.

The upper member 300 may be disposed on the anti-reflection member 200. The upper member 300 may include a first hard coating layer 310, a protection layer 320, a first upper adhesive layer 330, a window 340, a second upper adhesive layer 350, a black matrix 360, an impact absorbing layer 370, and a second hard coating layer 380. However, the invention is not limited to the above-described components contained in the upper member 300. At least a portion of the above-described components may be omitted, and other components may be added.

The first hard coating layer 310 may be disposed as an outermost layer of the display device 1000, such as to define an outermost surface of the display device 1000. The first hard coating layer 310 may be a functional layer for improving a usage property of the display device 1000. The first hard coating layer 310 may be applied on the protection layer 320. In an embodiment, for example, an anti-fingerprint property, an anti-pollution property, and an anti-scratch property may be improved by the first hard coating layer 310.

The protection layer 320 may be disposed below the first hard coating layer 310. The protection layer 320 may protect components disposed therebelow. The first hard coating layer 310, an anti-fingerprint layer, or the like may be additionally provided to the protection layer 320 to improve properties such as chemical resistance or wear resistance. The protection layer 320 may include a film having an elastic modulus of about 15 gigapascals (GPa) or less at the room temperature. The protection layer 320 may have a thickness of about 50 μm to about 60μ, e.g., about 55μ. However, the invention is not limited to the thickness of the protection layer 320. In an embodiment, the protection layer 320 may be omitted.

The first upper adhesive layer 330 may be disposed below the protection layer 320. The protection layer 320 and the window 340 may be coupled to each other by the first upper adhesive layer 330. The first upper adhesive layer 330 may have a thickness of about 20 μm to about 30 μm, e.g., about 25 μm. However, the invention is not limited to the thickness of the first upper adhesive layer 330.

The window 340 may be disposed below the first upper adhesive layer 330. The window 340 may include an optically clear insulating material. In an embodiment, for example, the window 340 may include a glass substrate or a synthetic resin film. When the window 340 is the glass substrate, the window 340 may have a thickness of about 80 μm or less, e.g., about 30 μm. However, the invention is not limited to the thickness of the window 340.

When the window 340 is the synthetic resin film, the window 340 may include a polyimide (PI) film or a polyethylene terephthalate (PET) film.

The window 340 may have a multi-layer structure or a single-layer structure. In an embodiment, for example, the window 340 may include a plurality of synthetic resin films coupled by an adhesive or a glass substrate and a synthetic resin film, which are coupled by an adhesive.

The second upper adhesive layer 350 may be disposed below the window 340. The window 340 and the impact absorbing layer 370 may be coupled to each other by the second upper adhesive layer 350. The second upper adhesive layer 350 may have a thickness of about 30 μm to about 40 μm, e.g., about 35 μm. However, the invention is not limited to the thickness of the second upper adhesive layer 350.

In an embodiment, for example, each of a window sidewall 340S of the window 340 and a second upper adhesive layer sidewall 350S of the second upper adhesive layer 350 may be disposed at an inner side of a display panel sidewall 1000S of the display panel 100 and a protection layer sidewall 320S of the protection layer 320. The feature of being disposed at the inner side may represent a feature of being closer to the active area 1000A than other comparative objects. That is, the window sidewall 340S and the second upper adhesive layer sidewall 350S of the second upper adhesive layer 350 may be disposed spaced apart from and closer to the active area 1000A than the display panel sidewall 1000S and the protection layer sidewall 320S.

A position relationship between layers may be varied according to a folding operation of the display device 1000. According to an embodiment, since the window sidewall 340S of the window 340 is disposed at an inner side and closer to the active area 1000A than each of the display panel sidewall 1000S of the display panel 100 and the protection layer sidewall 320S of the protection layer 320, a probability in which the window sidewall 340S of the window 340 protrudes further than the protection layer sidewall 320S of the protection layer 320 may be reduced although the position relationship between the layers are varied according to a folding operation of the display device 1000. Thus, a possibility in which an external impact is transmitted through the window sidewall 340S of the window 340 may decrease. As a result, a probability in which a crack is generated in the window 340 may decrease.

A first distance 340W between the window sidewall 340S of the window 340 and the protection layer sidewall 320S of the protection layer 320 may be equal to or greater than a predetermined (or reference) distance. Here, the first distance 340W may represent a distance parallel to the first direction DR1. Also, when viewed on a plane, the first distance 340W may correspond to a distance between the window sidewall 340S and the protection layer sidewall 320S.

The first distance 340W may be about 180 μm to about 205 μm, e.g., about 196 μm. However, the invention is not limited thereto. In an embodiment, for example, the first distance 340W may be equal to or greater than about 50 μm or may be about 300 μm. When the first distance 340W increases, the protection layer 320 may further protrude than the window 340, and as a portion of the protection layer 320 is bent according to a folding operation of the display device 1000, the bent portion may be attached to another component, e.g., a case, of the display panel 100. Also, as an area (e.g., planar area) of the protection layer 320 increases, a probability in which foreign substances introduced from an upper portion of the protection layer 320 are introduced to a lower portion of the protection layer 320 may decrease.

Also, the window 340 and the second upper adhesive layer 350 may be attached to the impact absorbing layer 370, through a lamination process. Each of the window 340 and the second upper adhesive layer 350 may has an area less than that of the impact absorbing layer 370 in consideration of a tolerance of the lamination process. Also, the second upper adhesive layer 350 may have an area less than that of the window 340. In an embodiment, for example, a pressure may be applied to the second upper adhesive layer 350 in a process of attaching the window 340. The second upper adhesive layer 350 may receive the pressure and be stretched or compressed to extend in a direction parallel to the first direction DR1 and the second direction DR2. Here, the second upper adhesive layer 350 may have an area less than that of the window 340 so that the second upper adhesive layer 350 does not protrude further than the window 340 by the pressure.

When the first upper adhesive layer 330 and the second upper adhesive layer 350 are attached, the window 340 may not be slipped during the folding operation of the display device 1000 to generate a buckling phenomenon in the window 340. However, according to an embodiment, the second upper adhesive layer 350 has an area less than that of the window 340. Thus, the first upper adhesive layer 330 may not be attached to the second upper adhesive layer 350, and a probability in which foreign substances are attached to the second upper adhesive layer 350 may decrease.

A second distance 350W between the second upper adhesive layer sidewall 350S of the second upper adhesive layer 350 and the protection layer sidewall 320S of the protection layer 320 may be equal to or greater than a predetermined distance. Here, the second distance 350W may represent a distance parallel to the first direction DR1. Also, when viewed on the plane, the second distance 350W may correspond to a distance between the second upper adhesive layer sidewall 350S and the protection layer sidewall 320S.

The second distance 350W may be about 392 μm. However, the invention is not limited thereto. In an embodiment, for example, the second distance 350W may be selected in a range from about 292 μm to about 492 μm. However, the invention is not limited to the range.

The black matrix 360 may be disposed between the impact absorbing layer 370 and the second upper adhesive layer 350. The black matrix 360 may be printed on a top surface of the impact absorbing layer 370. The black matrix 360 may overlap the peripheral area 1000NA. The black matrix 360 may be a colored layer provided by a coating method. The black matrix 360 may include a colored organic material or opaque metal. However, the invention is not limited to the material of the black matrix 360.

Although the black matrix 360 is disposed on the top surface of the impact absorbing layer 370 as an example in FIG. 2, the invention is not limited to the position of the black matrix 360. In an embodiment, for example, the black matrix 360 may be disposed on a top surface of the protection layer 320, a bottom surface of the protection layer 320, a top surface of the window 340, or a bottom surface of the window 340. Also, the black matrix 360 may include a plurality of layers. In this case, one portion of the plurality of layers may be disposed on the top surface of the protection layer 320, and the other portion of the plurality of layers (e.g., a remaining portion) may be disposed on the bottom surface of the protection layer 320, the top surface of the window 340, or the bottom surface of the window 340.

The impact absorbing layer 370 may be a functional layer for protecting the display panel 100 from an external impact. The impact absorbing layer 370 may be selected from films each having an elastic modulus of about 1 GPa or more at the room temperature. The impact absorbing layer 370 may be an elongated film having an optical function. In an embodiment, for example, the impact absorbing layer 370 may be an optical axis control film. The impact absorbing layer 370 may have a thickness of about 35 μm to about 45 μm, e.g., about 41 μm. However, the invention is not limited to the thickness of the impact absorbing layer 370. In an embodiment, the impact absorbing layer 370 may be omitted.

When the impact absorbing layer 370 is omitted, the anti-reflection member 200 may be attached to the window 340 through an adhesive layer. The anti-reflection member 200 may contact a bottom surface of a second adhesive layer 1020, and the window 340 may contact a top surface of the second adhesive layer 1020. When the impact absorbing layer 370 is omitted, the black matrix 360 may be disposed on the top surface of the protection layer 320, the bottom surface of the protection layer 320, the top surface of the window 340, or the bottom surface of the window 340. As being in contact, elements may form an interface therebetween, without being limited thereto.

The second hard coating layer 380 may be disposed on a surface of the impact absorbing layer 370. The impact absorbing layer 370 may have a curved surface. The top surface of the impact absorbing layer 370 may contact the second upper adhesive layer 350. Thus, curvedness of the top surface of the impact absorbing layer 370 may be filled by the second upper adhesive layer 350. Thus, an optical issue may not be generated at the top surface of the impact absorbing layer 370. The bottom surface of the impact absorbing layer 370 may be flattened by the second hard coating layer 380. That is, when a first hole is provided in the second adhesive layer 1020, a surface of an underlying layer (e.g., second hard coating layer 380) exposed to outside the second adhesive layer 1020 by the first hole may have a smooth surface. Thus, as the second hard coating layer 380 covers an uneven surface of the impact absorbing layer 370, a haze that is able to be generated in the uneven surface may decrease.

The upper member 300 may be coupled with the anti-reflection member 200 through the second adhesive layer 1020. The second adhesive layer 1020 may include a typical adhesive or sticking agent. The second adhesive layer 1020 may have a thickness of about 20 μm to about 30 μm, e.g., about 25 μm. However, the invention is not limited to the thickness of the second adhesive layer 1020.

The lower functional layers may be disposed below the display panel 100. In an embodiment, for example, the lower functional layers may include a lower protection film 400, a light shielding layer 500, a support member 600, a lower member 700 provided in plural including a plurality of lower members 700 providing a lower member layer, and a step compensation member 800. However, the invention is not limited to the above-described components of the lower functional layers. At least a portion of the above-described components may be omitted, and other components may be added.

The lower protection film 400 may be coupled to a rear surface of the display panel 100 through a third adhesive layer 1030. The lower protection film 400 may prevent scratches from being generated on the rear surface of the display panel 100 in a process of manufacturing (or providing) the display panel 100. The lower protection film 400 may be a colored polyimide film. In an embodiment, for example, the lower protection film 400 may be an opaque yellow film. However, the invention is not limited thereto.

The lower protection film 400 may have a thickness of about 40 μm to about 80 μm, e.g., about 68 μm. The third adhesive layer 1030 may have a thickness of about 13 μm to about 25 μm, e.g., about 18 μm. However, the invention is not limited to the thickness of the lower protection film 400 and the thickness of the third adhesive layer 1030.

The light shielding layer 500 may be disposed below the lower protection film 400 and disposed on the support member 600 that will be described later. The light shielding layer 500 may be a light shielding coating layer applied on a top surface of the support member 600. The light shielding layer 500 may contact the top surface of the support member 600.

The light shielding layer 500 may have an electrical resistance greater than that of the support member 600. In an embodiment, the light shielding layer 500 may have an electrical resistance of about $1 \times 10^{11}$ Ohms ($\Omega$) or less. In an embodiment, for example, the light shielding layer 500 may have an electrical resistance of about $1.0 \times 10^5 \Omega$ or more to about $1.0 \times 10^{11} \Omega$ or less.

The light shielding layer 500 may include a light absorbing material, more particularly a light shielding material, to prevent external light from being reflected by the support member 600 disposed at a lower portion. In an embodiment, for example, the light shielding layer 500 may include a black dye or a black pigment. In an embodiment, the light shielding layer 500 may include chrome carbide (CrC) as the black pigment. However, the invention is not limited thereto. In an embodiment, for example, the light shielding layer 500 may include carbon black as the black pigment.

In an embodiment, the light shielding layer 500 may include a polymer resin that is a medium in which the black pigment is dispersed. The light shielding layer 500 may include chrome carbide or carbon black that is dispersed in a polymer material such as an acrylic resin, a melamine resin, and an epoxy resin. The light shielding layer 500 may further include cellulose acetate butyrate as the polymer material. The light shielding layer 500 may be a single layer made of a polymer resin in which chrome carbide or carbon black is dispersed.

The light shielding layer 500 may include at least one of a curing agent, a silane coupling agent, and amorphous silica particles. The light shielding layer 500 may include block polyisocyanate as the curing agent. The light shielding layer 500 may include glycidoxy propyl trimethoxy silane as the silane coupling agent.

The light shielding layer 500 may further include a crosslink density additive. The crosslink density additive may accelerate a crosslinking reaction when the light shielding layer 500 is formed to improve a crosslink density and a surface adhesive force of the light shielding layer 500. The crosslink density additive may be a co-crosslinking agent. In an embodiment, for example, the crosslink density additive may include trimethylopropane trimethacrylate. As the light shielding layer 500 further includes the crosslink density additive, the light shielding layer 500 may maintain a low surface roughness and improve a surface adhesive force.

A solid content contained in the light shielding layer 500 may have a mean particle size of about 0.01 μm or more to about 0.10 μm or less. In an embodiment, for example, the solid content contained in the light shielding layer 500 may have a mean particle size of about 0.05 micrometer (μm). When the solid content contained in the light shielding layer 500 has a mean particle size less than about 0.01 μm, as the solid content is not realized, and the surface adhesive force of the light shielding layer 500 is reduced, an adhesive force with an additional adhesive layer 1050 disposed thereabove may be reduced. When the solid content contained in the light shielding layer 500 has a mean particle size greater than about 0.10 μm, as the surface roughness of the light shielding layer 500 increases, the surface of the light shielding layer 500 may be seen from the outside. In this specification, the surface roughness may represent an arithmetic mean roughness (Ra).

The light shielding layer 500 may have an arithmetic mean roughness of about 0.50 μm or less. When the light shielding layer 500 has an arithmetic mean roughness greater than about 0.50 μm, as a quality of the surface of the light shielding layer 500 is degraded, and the surface of the light shielding layer 500 is seen from the outside, visibility of the display device may be degraded.

The display device 1000 according to an embodiment may further include the additional adhesive layer 1050 disposed between the light shielding layer 500 and the lower protection film 400. The light shielding layer 500 may be attached to the lower protection film 400 by the additional adhesive layer 1050. The additional adhesive layer 1050 may be disposed between the light shielding layer 500 and the lower protection film 400 to couple the light shielding layer 500 and the lower protection film 400 to each other. The light shielding layer 500 may be attached to the lower protection film 400 solely by the additional adhesive layer 1050. The light shielding layer 500 may contact a bottom surface of the additional adhesive layer 1050, and the lower protection film 400 may contact a top surface of the additional adhesive layer 1050.

The additional adhesive layer 1050 may be a transparent adhesive layer such as a pressure sensitive adhesive film (PSA), an optically clear adhesive film (OCA), or an optically clear resin (OCR). In an embodiment, the additional adhesive layer 1050 may be the pressure sensitive adhesive film (PSA).

The light shielding layer 500 may have an adhesive force of about 800 gram-force per inch (gf/inch) or more when the additional adhesive layer 1050 is a target to be attached to the light shielding layer 500. That is, a surface adhesive force of the light shielding layer 500 to the additional adhesive layer 1050 may be about 800 gf/inch or more. When the surface adhesive force of the light shielding layer 500 to the additional adhesive layer 1050 is less than about 800 gf/inch, reverse delamination may be generated in a process of attaching the additional adhesive layer 1050 onto the light shielding layer 500 since an adhesive force between the light shielding layer 500 and the additional adhesive layer 1050 is less than that between a release film and the additional adhesive layer 1050.

In an embodiment, the additional adhesive layer 1050 may not be disposed at an area, in which an opening 611 is defined in the support member 600. That is, the additional adhesive layer 1050 may include a first additional adhesive layer 1050-1 and a second additional adhesive layer 1050-2. The first additional adhesive layer 1050-1 and the second additional adhesive layer 1050-2 may be spaced apart from each other with an opening area in which the opening 611 is defined therebetween. That is, the additional adhesive layer 1050 may be disconnected at the second area 1000A2 as a folding area.

The light shielding layer 500 may have a thickness of about 7 μm or more to about 13 μm or less. The light shielding layer 500 may have a thickness of about 8 μm or more to about 12 μm or less. When the light shielding layer 500 has a thickness less than about 7 μm, a light shielding property of the light shielding layer 500 may be degraded, and durability of the light shielding layer 500 applied onto the support member 600 may be degraded. When the light shielding layer 500 has a thickness greater than about 13 μm, a folding characteristic of the display device 1000 may be degraded by the thick light shielding layer 500, and a film formation characteristic of the light shielding layer 500 may be degraded.

A process of manufacturing (or providing) the display device 1000 according to an embodiment may include a process of attaching the support member 600 coated with the light shielding layer 500, to the lower protection film 400, after the light shielding layer 500 is applied onto the support member 600 contained in the display device 1000. The support member 600 coated with the light shielding layer 500 may be attached to the lower protection film 400 by the additional adhesive layer 1050.

The light shielding layer 500 may be provided by applying paint including a light shielding material onto the support member 600. In a process of applying the paint including the light shielding material, the paint may be applied onto the support member 600 by using various methods. In an embodiment, for example, the paint may be applied onto the support member 600 through physical vapor deposition (PVD), chemical vapor deposition (CVD), or spray coating. However, the invention is not limited thereto.

The light shielding material contained in the paint may be the above-described black dye or black pigment. The light shielding material may include chrome carbide and/or carbon black.

The paint may further include at least one of a polymer resin, a curing agent, a silane coupling agent, amorphous silica particles, a crosslink density additive, and a solvent. The polymer resin contained in the paint may be an acrylic resin, a melamine resin, or an epoxy resin. The polymer resin contained in the paint may be cellulose acetate butyrate. The curing agent contained in the paint may be block polyisocyanate. The silane coupling agent contained in the paint may be glycidoxy propyl trimethoxy silane. The crosslink density additive contained in the paint may be co-crosslinking agent such as trimethylopropane trimethacrylate.

The solvent contained in the paint may include any material that dissolves other components and maintains a property of the paint as a coating solution without limitation. In an embodiment, for example, the solvent may include at least one of formaldehyde, n-butanol, butyl acetate, methylisobutyl ketone, isobutyl acetate, 1-methoxy-2propyl acetate, isobutyl alcohol, ethylene glycol tertiary butyl ether, ethyl benzene, and xylene.

In an embodiment, with respect to 100% of the paint, the paint may include about 20% or more to about 30% or less of the polymer resin, about 2% or more to about 4% or less of the curing agent, about 1% or more to about 3% or less of the silane coupling agent, about 3% or more to about 7% or less of the amorphous silica particles, about 1% or more to about 3% or less of the black pigment, about 5% or more to about 7% or less of the crosslink density additive, and about 48% or more to about 65% or less of the solvent.

In an embodiment, a solid content contained in the paint may have a mean particle size of about 0.01 µm or more to about 1.0 µm or less. More specifically, the solid content contained in the paint may have a mean particle size of about 0.02 µm or more to about 0.08 µm or less.

The support member 600 may be disposed below the light shielding layer 500. In an embodiment, as the light shielding layer 500 is applied onto the support member 600, the light shielding layer 500 and the support member 600 may contact each other. The light shielding layer 500 may contact the top surface of the support member 600. The support member 600 may support components disposed thereabove.

A lower adhesive layer 620 and a cover layer 630 may be disposed below the support member 600. However, the invention is not limited to the above-described components disposed below the support member 600. At least a portion of the above-described components may be omitted, and other components may be added.

The support member 600 may include a material having an elastic modulus of about 60 GPa or more at the room temperature. The support member 600 may include metal. The support member 600 may include a single metal material or an alloy of a plurality of metal materials. Although the support member 600 may be, e.g., SUS304, the invention is not limited thereto. The support member 600 may support components disposed thereabove. Also, the support member 600 may improve a heat dissipation performance of the display device 1000 and function as a heat dissipation member.

In an embodiment, the support member 600 may have an electrical resistance of about 0.1Ω or more to about 10.0Ω or less. In an embodiment, for example, the support member 600 may have an electrical resistance of about 1.0Ω or more to about 5.0Ω or less. However, the invention is not limited thereto.

The opening 611 may be defined in a portion of the support member 600. The opening 611 may be defined in an area overlapping the second area 1000A2. A solid portion of the support member 600 may define one or more of the opening 611. On the plane, e.g., when viewed in the third direction DR3, the opening 611 may overlap the second area 1000A2. The opening 611 may allow a portion of the support member 600 to be further easily deformed in shape.

The cover layer 630 may be attached to the support member 600 by the lower adhesive layer 620. The lower adhesive layer 620 may include a typical adhesive or sticking agent. Unlike as illustrated in FIG. 2, the lower adhesive layer 620 may not be disposed on the area overlapping the second area 1000A2 of the support member 600. The cover layer 630 may cover the opening 611 of the support member 600. Thus, the cover layer 630 may additionally prevent foreign substances from being introduced to the opening 611.

The cover layer 630 may include a material having an elastic modulus lower than that of the support member 600. The cover layer 630 may include a material having an elastic modulus of about 30 megapascals (MPa) or less and an elongation of about 100% or more. In an embodiment, for example, the cover layer 630 may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. In an embodiment, for example, the cover layer 630 may include a thermoplastic polyurethane. However, the invention is not limited thereto. The cover layer 630 may be a thermoplastic polyurethane film having a mesh pattern.

The support member 600 may have a thickness of about 120 µm to about 180 µm, e.g., about 150 µm. The lower adhesive layer 620 may have a thickness of about 4 µm to about 15 µm, e.g., about 8 µm. The cover layer 630 may have a thickness of about 4 µm to about 15 µm, e.g., about 8 µm. However, the invention is not limited to the above-described values of the thickness of the support member 600, the thickness of the lower adhesive layer 620, and the thickness of the cover layer 630.

The lower members 700 may be disposed below the support member 600. The lower members 700 may be disposed below the cover layer 630. The lower members 700 may be spaced apart from each other. In an embodiment, for example, one of the lower members 700 may be disposed in (or corresponding to) the first area 1000A1, and another of the lower members 700 may be disposed in the third area 1000A3.

Each of the lower members 700 may be attached to a lower portion of the cover layer 630 by a fourth adhesive layer 1040 provided in plural including a plurality of fourth adhesive layers 1040. In an embodiment, for example, one of the fourth adhesive layer 1040 may be attached to a bottom surface of the support member 600 overlapping the first area 1000A1, and another of the fourth adhesive layer 1040 may be attached to the bottom surface of the support member 600 overlapping the third area 1000A3. That is, the fourth adhesive layers 1040 may not overlap the second area 1000A2, such as being spaced apart therefrom. Each of the fourth adhesive layers 1040 may have a thickness of about 8 µm to about 15 µm, e.g., about 8 µm. However, the invention is not limited to the thickness of each of the fourth adhesive layers 1040.

Each of the lower members 700 may include a lower plate 710, a heat dissipation sheet 720, and an insulation film 730.

However, the invention is not limited to the above-described components contained in each of the lower members 700. At least a portion of the above-described components may be omitted, and other components may be added.

The lower plate 710 may be provided in plural including a plurality of lower plates 710. One of the lower plates 710 may overlap the first area 1000A1 and a portion of the second area 1000A2, and the other of the lower plates 710 may overlap the other portion of the second area 1000A2 and the third area 1000A3.

The lower plates 710 may be spaced apart from (or disconnected from) each other in the second area 1000A2. However, the lower plates 710 may be disposed maximally adjacent to each other to support the area in which the opening 611 is defined in the support member 600. In an embodiment, for example, the lower plates 710 may prevent a shape of the area in which the opening 611 is defined in the support member 600 from being deformed by a pressure applied from thereabove.

Also, the lower plates 710 may serve to prevent shapes of components disposed on the lower members 700 from being deformed by components disposed below the lower members 700.

Each of the lower plates 710 may include a metal alloy, e.g., a copper alloy. However, the invention is not limited to the material of the lower plates 710. Each of the lower plates 710 may have a thickness of about 60 µm to about 100 µm, e.g., about 80 µm. However, the invention is not limited to the thickness of each of the lower plates 710.

The heat dissipation sheet 720 may be attached to a lower portion of the lower plate 710. The heat dissipation sheet 720 may be a thermal conductive sheet having high thermal conductivity. In an embodiment, for example, the heat dissipation sheet 720 may include a heat dissipation layer 721, a first heat dissipation adhesive layer 722, a second heat dissipation adhesive layer 723, and a gap tape 724.

The gap tape 724 may be attached to the first heat dissipation adhesive layer 722 and the second heat dissipation adhesive layer 723, which are spaced apart from each other with the heat dissipation layer 721 therebetween. The gap tape 724 may include a plurality of layers. In an embodiment, for example, the gap tape 724 may include a gap tape base layer, an upper gap tape adhesive layer disposed on a top surface of the gap tape base layer, and a lower gap tape adhesive layer disposed on a bottom surface of the gap tape base layer.

The heat dissipation layer 721 may be attached to the lower plate 710 by the first heat dissipation adhesive layer 722. The heat dissipation layer 721 may be sealed by the first heat dissipation adhesive layer 722 together with the second heat dissipation adhesive layer 723 and the gap tape 724. The heat dissipation layer 721 may be a graphitized polymer film. The polymer film may be, e.g., a polyimide film. Each of the first heat dissipation adhesive layer 722 and the second heat dissipation adhesive layer 723 may have a thickness of about 3 µm to about 8 µm, e.g., about 5 µm. Each of the heat dissipation layer 721 and the gap tape 724 may have a thickness of about 10 µm to about 25 µm, e.g., about 17 µm. However, the invention is not limited to the above-described value of the thickness of each of the first heat dissipation adhesive layer 722, the second heat dissipation adhesive layer 723, the heat dissipation layer 721, and the gap tape 724.

The insulation film 730 may be attached to a lower portion of the heat dissipation sheet 720. In an embodiment, for example, the insulation film 730 may be attached to the second heat dissipation adhesive layer 723. The insulation film 730 may prevent rattle from being generated in the display device 1000. Although the insulation film 730 may have a thickness of about 15 µm, the invention is not limited thereto.

The step compensation member 800 may be attached to a lower portion of the support member 600. In an embodiment, for example, the lower adhesive layer 620 may be attached to one lower portion of the support member 600, and the step compensation member 800 may be attached to another lower portion of the support member 600.

The step compensation member 800 may include a first compensation adhesive layer 810, a step compensation film 820, and a second compensation adhesive layer 830. The first compensation adhesive layer 810 may be attached to the bottom surface of the support member 600. The step compensation film 820 may be a synthetic resin film. The second compensation adhesive layer 830 may be attached to a bottom surface of the step compensation film 820 and a set (not shown).

Although not shown, a cushion film including a cushion layer may be further disposed below the lower members 700 or below the step compensation member 800.

The display device 1000 according to an embodiment of includes the support member 600 disposed below the window 340 and the display panel 100, to support the window 340 and the display panel 100, and the light shielding layer 500 including a light shielding material is disposed on the support member 600. The light shielding layer 500 may be applied to the top surface of the support member 600. Thus, the display device 1000 according to an embodiment may have an improved impact resistance to an external impact and reduce reflection of external light.

More specifically, in case that a cushion layer having compressibility such as sponge is disposed between the lower protection film 400 and the support member 600, when the cushion layer is compressed by an external impact, the window 340 and the display panel 100 may be also compressed to cause a defect such as a crack or bending. However, in the display device 1000 according to one or more embodiment, the cushion layer disposed between the lower protection film 400 and the support member 600 may be omitted, or the cushion layer may be moved in position to be disposed below the lower members 700, and the lower protection film 400 disposed below the display panel 100 and the support member 600 which is coated with the light shielding layer 500 may be directly attached to each other through the additional adhesive layer 1050. Thus, the display device 1000 may have the improved impact resistance to an external impact, which is greater than that of when the conventional cushion layer having the compressibility is disposed between the support member 600 and the display panel 100. Also, as the light shielding layer 500 includes the black light shielding material, external light may be prevented from being reflected by the support member 600, and the visibility of the display device 1000 may be improved.

Figure 4A:
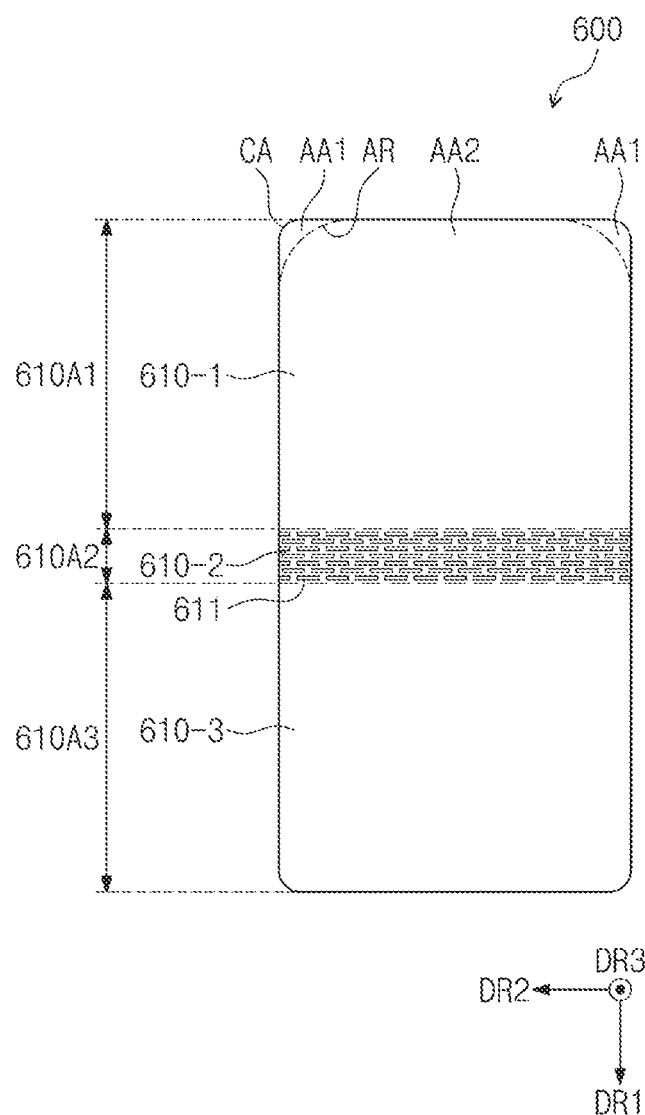
FIG. 4A is a plan view illustrating a support member according to an embodiment.
Figure 4B:
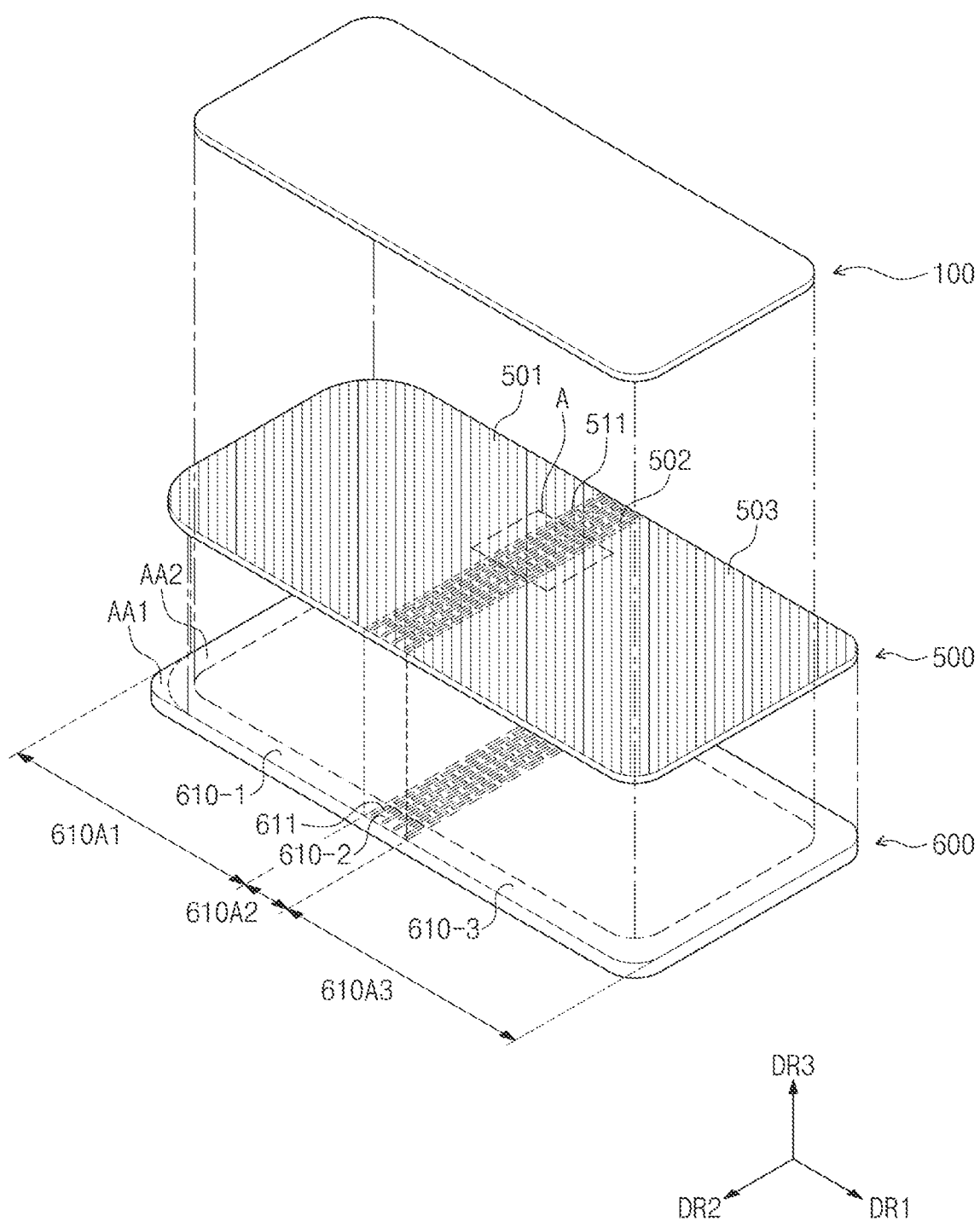
FIG. 4B is a perspective view illustrating a portion of components contained in the display device according to an embodiment.
Figure 5A:
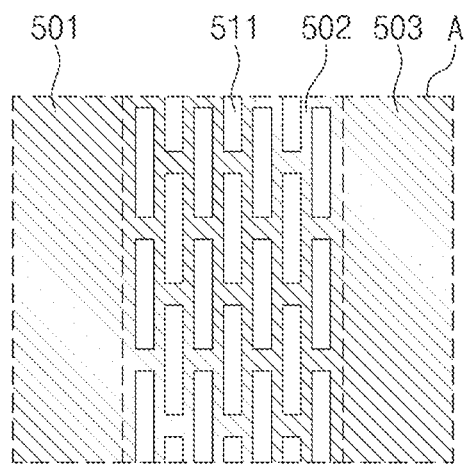
FIGS. 5A and 5B are plan views illustrating a partial area of the display device according to an embodiment.
Figure 5B:
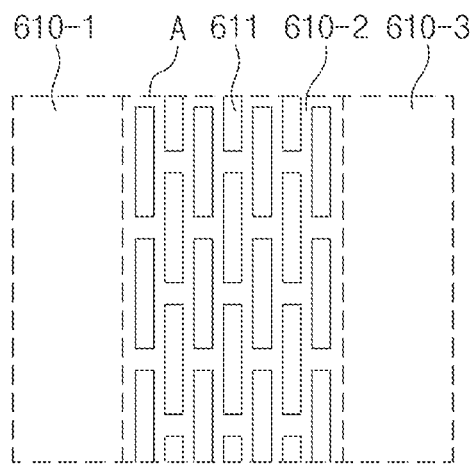

FIG. 4A is a plan view illustrating a portion of components contained in the display device 1000 according to an embodiment. FIG. 4B is a perspective view illustrating a portion of the components contained in the display device 1000 according to an embodiment. FIG. 4A illustrates a plan view of the support member 600 of the display device 1000 according to an embodiment. FIG. 4B illustrates an exploded perspective view illustrating the support member 600, and the light shielding layer 500 and the display panel 100 disposed on the support member 600 in the display device 1000 according to an embodiment. FIG. 5A is a plan view illustrating a portion overlapping area A of FIG. 4B in components of the display device 1000 according to an embodiment. FIG. 5B is a plan view illustrating a portion overlapping area A of FIG. 4B in the components of the display device 1000 according to an embodiment. FIG. 5A illustrates a plan view of a portion overlapping the area A of FIG. 4B in the light shielding layer 500, and FIG. 5B illustrates a plan view of a portion overlapping the area A of FIG. 4B in the support member 600.

Referring to FIG. 4A, the support member 600 may have various shapes. In FIG. 4A, the support member 600 having a rectangular shape having rounded corners on the plane is illustrated as an example. In an embodiment, the support member 600 may have a rectangular plate structure in which two pairs of sides each include sides which are parallel to each other. The support member 600 may have a short side (e.g., a first side) extending in the second direction DR2 and a long side (e.g., second side) extending in the first direction DR1 crossing the second direction DR2, where the short side has a smaller length than the long side. The long side and the short side of the support member 600, which are side surfaces of the support member 600, may be connected to each other to define an edge (e.g., an outer edge) of the support member 600. The support member 600 may include a corner CA connecting two adjacent sides to each other. More specifically, the support member 600 may include the corner CA corresponding to a portion at which the short side meets the long side. Although the corner CA of the support member 600 has a rounded shape having a curvature in FIG. 4A, the invention is not limited thereto. In an embodiment, for example, the corner CA of the support member 600 may have various shapes such as a polygon and an ellipse.

The support member 600 may include a first support member area AA1 and a second support member area AA2 which is adjacent to the first support member area AA1. The first support member area AA1 of the support member 600 may be an area that is arbitrary set to discharge static electricity generated from the surface of the display device 1000. In general, charges (e.g., electrical charges) provided by the static electricity generated from the surface of the display device 1000 may be accumulated in the display device 1000 to damage the display panel 100 including a circuit element. According to an embodiment, since the charges charged in the display device 1000 (refer to FIG. 1A) may be continuously removed by including the first support member area AA1 capable of inducing electrostatic discharge in the support member 600, the display device 1000 (refer to FIG. 1A) may have improved reliability. Also, although static electricity having energy deviated from an allowable range is applied to the display device 1000 (refer to FIG. 1A), the static electricity may be effectively removed through the first support member area AA1 of the support member 600 by using an electrostatic discharge induction unit to prevent a damage generated in an electrostatic test.

The first support member area AA1 of the support member 600 may overlap the peripheral area 1000NA (refer to FIG. 1B) of the display device 1000 (refer to FIG. 1A) and may not overlap the active area 1000A of the display device 1000 (refer to FIG. 1A).

However, the invention is not limited thereto. In an embodiment, for example, a portion of the first support member area AA1 of the support member 600 may overlap the active area 1000A of the display device 1000 (refer to FIG. 1A).

In an embodiment, the first support member area AA1 may correspond to at least one of the corners CA of the support member 600. In an embodiment, for example, the support member 600 may include four corners CA, and the first support member area AA1 may correspond to at least one of the four corners CA of the support member 600. Although the first support member area AA1 corresponding to two corners CA of the support member 600 is illustrated as an example in FIG. 4A, this is merely illustrative, and the invention is not limited thereto.

The first support member area AA1 in the support member 600 may be defined by at least one side or at least one arc that connects two adjacent sides among the sides of the support member 600 to each other. Thus, the first support member area AA1 in the support member 600 may have various shapes. In FIG. 4A, the first support member area AA1 defined by one arc AR which connects two adjacent sides of the support member 600 to each other is illustrated as an example. However, the invention is not limited thereto. The first support member area AA1 may be defined by one side connecting the two adjacent sides of the support member 600 to each other. In an embodiment, for example, the first support member area AA1 may be defined by one straight side instead of the arc AR connecting the two adjacent sides of the support member 600, and in this case, the first support member area AA1 may have a triangular shape.

Referring to FIGS. 2, 4A, and 4B together, the support member 600 of the display device 1000 according to an embodiment may include a first non-folding support area 610A1, a folding support area 610A2, and a second non-folding support area 610A3, which are arranged in order in the first direction DR1. The folding support area 610A2 of the support member 600 may overlap the second area 1000A2 of the active area 1000A of the display device 1000. The first non-folding support area 610A1 and the second non-folding support area 610A3 of the support member 600 may be connected to the folding support area 610A2, at least a portion of the first non-folding support area 610A1 may overlap the second area 1000A2 of the active area 1000A of the display device 1000, and at least a portion of the second non-folding support area 610A3 may overlap the second area 1000A2 of the active area 1000A of the display device 1000. At least a portion of the first non-folding support area 610A1 and the second non-folding support area 610A3 may overlap the peripheral area 1000NA of the display device 1000. The support member 600 may include a first plate non-folding part 610-1 overlapping the first non-folding support area 610A1, a plate folding part 610-2 (e.g., folding plate) overlapping the folding support area 610A2, and a second plate non-folding part 610-3 overlapping the second non-folding support area 610A3. The first plate non-folding part 610-1 together with the second plate non-folding part 610-3 may define a non-folding plate of the support member 600.

The plurality of openings 611 may be defined in or by the plate folding part 610-2 of the support member 600. The plurality of openings 611 may overlap the second area 1000A2 of the active area 1000A of the display device 1000. The plurality of openings 611 may be provided in a plurality of rows. The plurality of openings 611 may be provided at position in a plurality of rows that are alternately arranged.

The light shielding layer 500 may include a first light shielding layer part 501 overlapping the first non-folding support area 610A1, a second light shielding layer part 502 overlapping the folding support area 610A2, and a third light shielding layer part 503 overlapping the second non-folding support area 610A3. The first light shielding layer part 501 may overlap the first plate non-folding part 610-1 of the support member 600, the second light shielding layer part 502 may overlap the plate folding part 610-2 of the support member 600, and the third light shielding layer part 503 may overlap the second plate non-folding part 610-3 of the support member 600.

Referring to FIG. 4B, the light shielding layer 500 may be disposed on the support member 600. The light shielding layer 500 may overlap the second support member area AA2 of the support member 600 and may not overlap the first support member area AA1 of the support member 600 on the plane defined by the first direction DR1 and the second direction DR2 crossing the first direction DR1. That is, the light shielding layer 500 may be disposed on the second support member area AA2 of the support member 600 and may not be disposed on the first support member area AA1 of the support member 600. As the light shielding layer 500 does not overlap with the first support member area AA1 of the support member 600, the light shielding layer 500 may have a total planar area less than a total planar area of the support member 600. In an embodiment, the light shielding layer 500 may overlap an entirety of the second support member area AA2 of the support member 600.

When the light shielding layer 500 is provided by applying the paint including the light shielding material onto the support member 600, scratches may be generated on the surface of the light shielding layer 500 to expose a portion of the support member 600 to outside the light shielding layer 500. Since the support member 600 including a metal material has an electrical resistance relatively less than that of the light shielding layer 500, charges generated by the static electricity applied from the outside may be charged around the light shielding layer 500 and instantaneously discharged at the scratches, and at this time, a large amount of charges may be instantaneously discharged through the scratches to damage the display panel 100. In an embodiment, for example, when static electricity is generated during a process of manufacturing or using the display device 1000, instantaneous discharge may be generated by the scratches defined in the light shielding layer 500 to cause a malfunction of the display device 1000 or damage an internal circuit, or to cause a defect of the display device 1000 during the electrostatic test.

According to an embodiment, the display device 1000 including the light shielding layer 500 containing the light shielding material on the support member 600 may induce the static electricity generated from the surface of the display device 1000 to be discharged to the first support member area AA1 of the support member 600 by including the first support member area AA1 that does not overlap with the light shielding layer 500 on the plane and the second support member area AA2 overlapping the light shielding layer 500 on the plane. That is, the support member 600 including the light shielding layer 500 may define an electrostatic discharge support layer (or member). Thus, the internal circuits may be protected from the static electricity applied from the outside of the display device 1000. That is, since the static electricity applied to the display device 1000 may be effectively and safely removed through the first support member area AA1 of the support member 600, the display device 1000 may have improved reliability. Also, even when scratches are generated on the surface of the light shielding layer 500, the static electricity may be induced to be discharged through the first support member area AA1 of the support member 600 to prevent a defect in the electrostatic test, thereby improving productivity of the display device 1000.

Referring to FIG. 4B again, the display panel 100 may be disposed on the light shielding layer 500, such as to be disposed facing the light shielding layer 500. In an embodiment, the display panel 100 may overlap the second support member area AA2 of the support member 600 with the light shielding layer 500 therebetween, and may not overlap the first support member area AA1 of the support member 600 on the plane. However, the invention is not limited thereto. In an embodiment, for example, the display panel 100 may overlap the second support member area AA2 of the support member 600 and a portion of the first support member area AA1 on the plane. In the case that the display panel 100 does not overlap with the first support member area AA1, when the electrostatic discharge is generated in the first support member area AA1, damage to a circuit contained in the display panel 100 may be effectively prevented.

A light shielding opening 511 provided in plural including a plurality of light shielding openings 511 may be defined in the second light shielding layer part 502 of the light shielding layer 500. The plurality of light shielding openings 511 may respectively overlap (or correspond to) the plurality of openings 611 defined in the plate folding part 610-2 of the support member 600. More specifically, the light shielding openings 511 may have the same shape (e.g., planar shape) and the same arrangement as the plurality of openings 611. The light shielding openings 511 may be provided at a location in a plurality of rows that are alternately arranged. The light shielding layer 500 may be provided by applying the paint containing the light shielding material to the second support member area AA2 except for areas corresponding to the openings 611 of the support member 600 in the process of applying the light shielding layer 500 onto the top surface of the support member 600. Thus, the light shielding openings 511 and the openings 611 may entirely overlap each other, such as to be aligned with each other. That is, a layer such as the lower protection film 400 may be exposed to outside the light shielding layer 500 and the support member 600 at the aligned openings (e.g., the light shielding openings 511 together with the openings 611).

As the plurality of light shielding openings 511 defined in the light shielding layer 500 entirely overlap the openings 611 defined in the support member 600, the openings 611 defined in the support member 600 may maintain an opening shape on the plane instead of being covered by the light shielding layer 500. Thus, the folding support area 610A2 of the support member 600 may be easily deformed in shape when folded together with other layers of the display device 1000 without degradation of the folding characteristic thereof.

The light shielding layer 500 may be provided on the support member 600 by various methods. In an embodiment, for example, the light shielding layer 500 may be provided on the support member 600 through physical vapor deposition, chemical vapor deposition, or spray coating. However, the invention is not limited thereto.

Figure 6A:
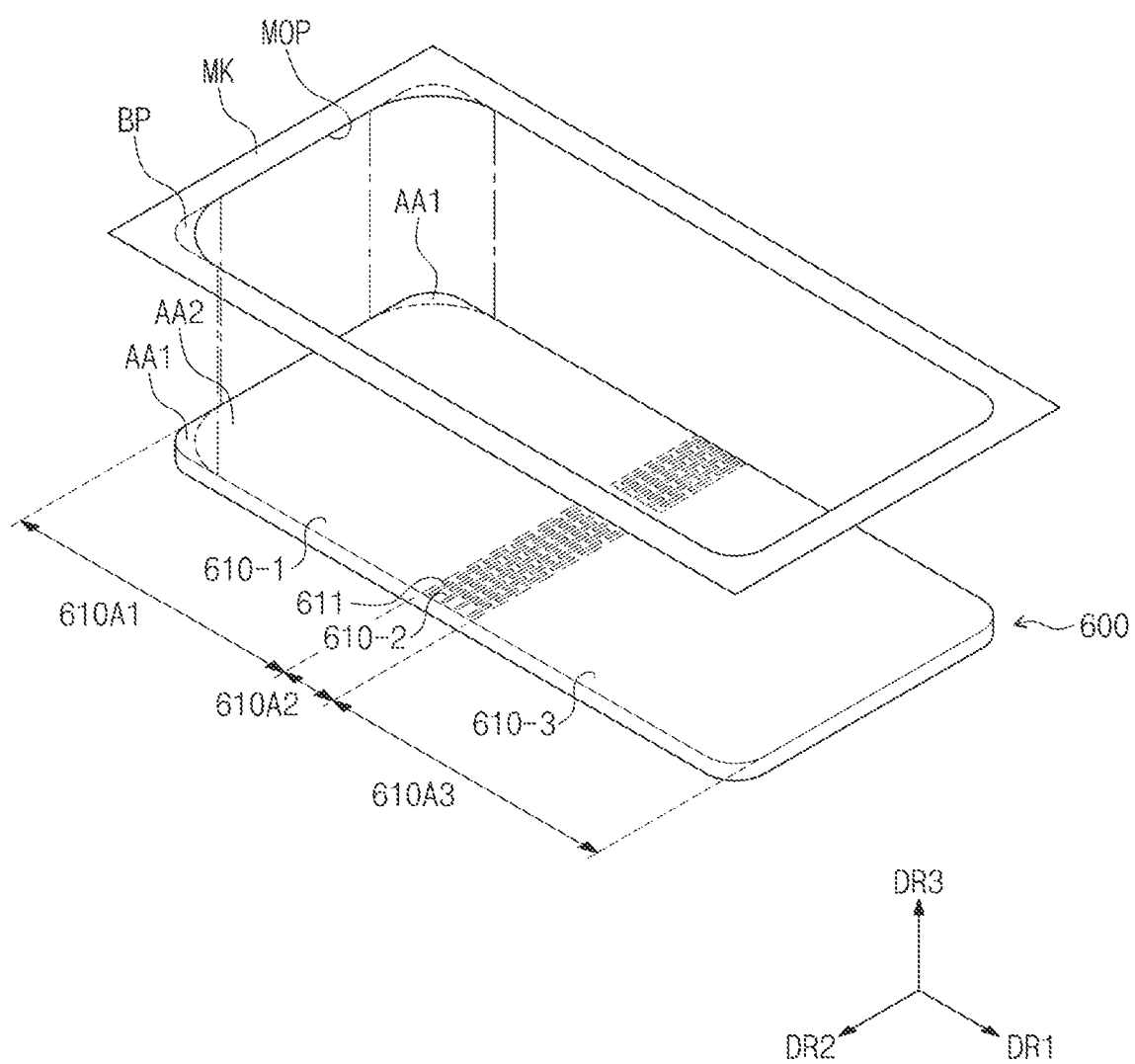
FIGS. 6A and 6B are perspective views for explaining a method for manufacturing a display device according to an embodiment.
Figure 6B:
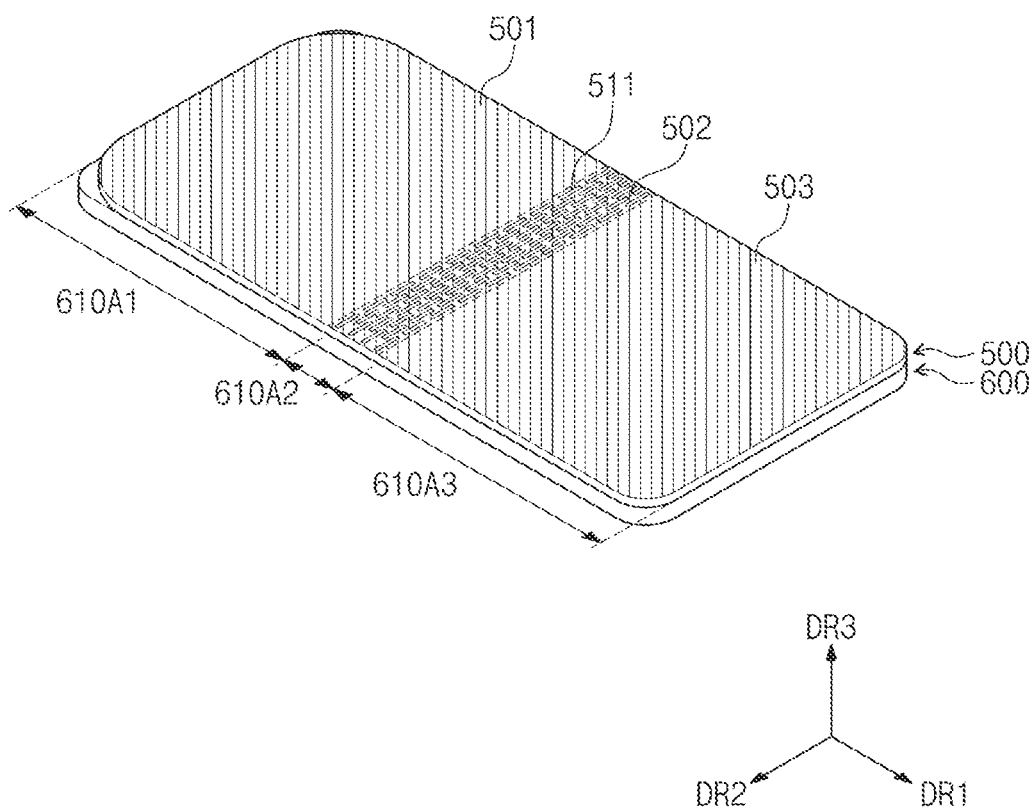

FIGS. 6A and 6B are perspective views illustrating a portion of a method for manufacturing (or providing) a display device 1000 according to an embodiment. FIG. 6A is a view illustrating a process of arranging a mask MK on a support member 600, and FIG. 6B is a view illustrating a process of forming (or providing) a light shielding layer 500, such as by applying paint, onto the support member 600. The same components as those described in FIGS. 2 to 5B are designated by the same reference symbols, and an overlapped description will be omitted.

Referring to FIG. 6A, the method for manufacturing the display device 1000 according to an embodiment may include a process of arranging the mask MK in which a first opening MOP is defined, onto the support member 600.

The mask MK may be provided on the support member 600 to face the support member 600. The mask MK in which the first opening MOP is defined may be aligned with the support member 600. The first opening MOP overlapping a second support member area AA2 of the support member 600 may be defined in the mask MK. The first opening MOP may overlap an entirety of the second support member area AA2 of the support member 600. As the first opening MOP defined in the mask MK overlaps the entirety of the second support member area AA2 of the support member 600, the paint for forming the light shielding layer 500 may be applied onto the entirety of the second support member area AA2 of the support member 600. The first opening MOP defined in the mask MK may have the same planar area and/or overall planar shape as that of a portion corresponding to the second support member area AA2 in the support member 600. However, the invention is not limited thereto. In an embodiment, for example, the first opening MOP may have a planar area less or greater than that of the portion corresponding to the second support member area AA2 in the support member 600.

The mask MK may include a blocking part BP overlapping or corresponding to a first support member area AA1 of the support member 600. When the mask MK is arranged on the support member 600, the blocking part BP of the mask MK may cover the entirety of the first support member area AA1 of the support member 600. Thus, the paint containing a light shielding material may not be applied to the first support member area AA1 of the support member 600. When the paint for forming the light shielding layer 500 is applied onto the support member 600, the paint may be blocked by the blocking part BP and may not be provided to the first support member area AA1 of the support member 600. Thus, the light shielding layer 500 may not be formed on the first support member area AA1 of the support member 600. The support member 600 may be exposed to outside the light shielding layer 500 at the first support member area AA1.

Referring to FIGS. 6A and 6B, the mask MK may be arranged on the support member 600, and then the paint for forming the light shielding layer 500 may be provided onto the support member 600. In an embodiment, the paint may be provided onto the support member 600 through physical vapor deposition, chemical vapor deposition, or spray coating. Although not shown, a lower mask may be further disposed below the support member 600 in addition to the mask MK disposed above the support member 600.

Since the first opening MOP defined in the mask MK overlaps the second support member area AA2 of the support member 600 and does not overlap with the first support member area AA1 of the support member 600, the paint for forming the light shielding layer 500 may be applied only onto the second support member area AA2 and may not be applied onto the first support member area AA1. Accordingly, the light shielding layer 500 having a planar shape in FIG. 6B may be formed. Since the second support member area AA2 of the support member 600 overlaps the first opening MOP defined in the mask MK, the paint for forming the light shielding layer 500 may be applied only onto the second support member area AA2.

In an embodiment, the method may include providing an electrostatic discharge support layer (e.g., support member 600 together with light shielding layer 500) of the display device 1000, the electrostatic discharge support layer including a light shielding layer 500 on a support member 600, and attaching the electrostatic discharge support layer to a display panel 100 of the display device 1000. The attaching of the electrostatic discharge support layer to the display panel 100 disposes a first support member area AA1 of the support member 600 exposed outside of the light shielding layer 500 and non-overlapping the display panel 100, and a second support member area AA2 of the support member 600 overlapping both the light shielding layer 500 and the display panel 100.

Figure 7:
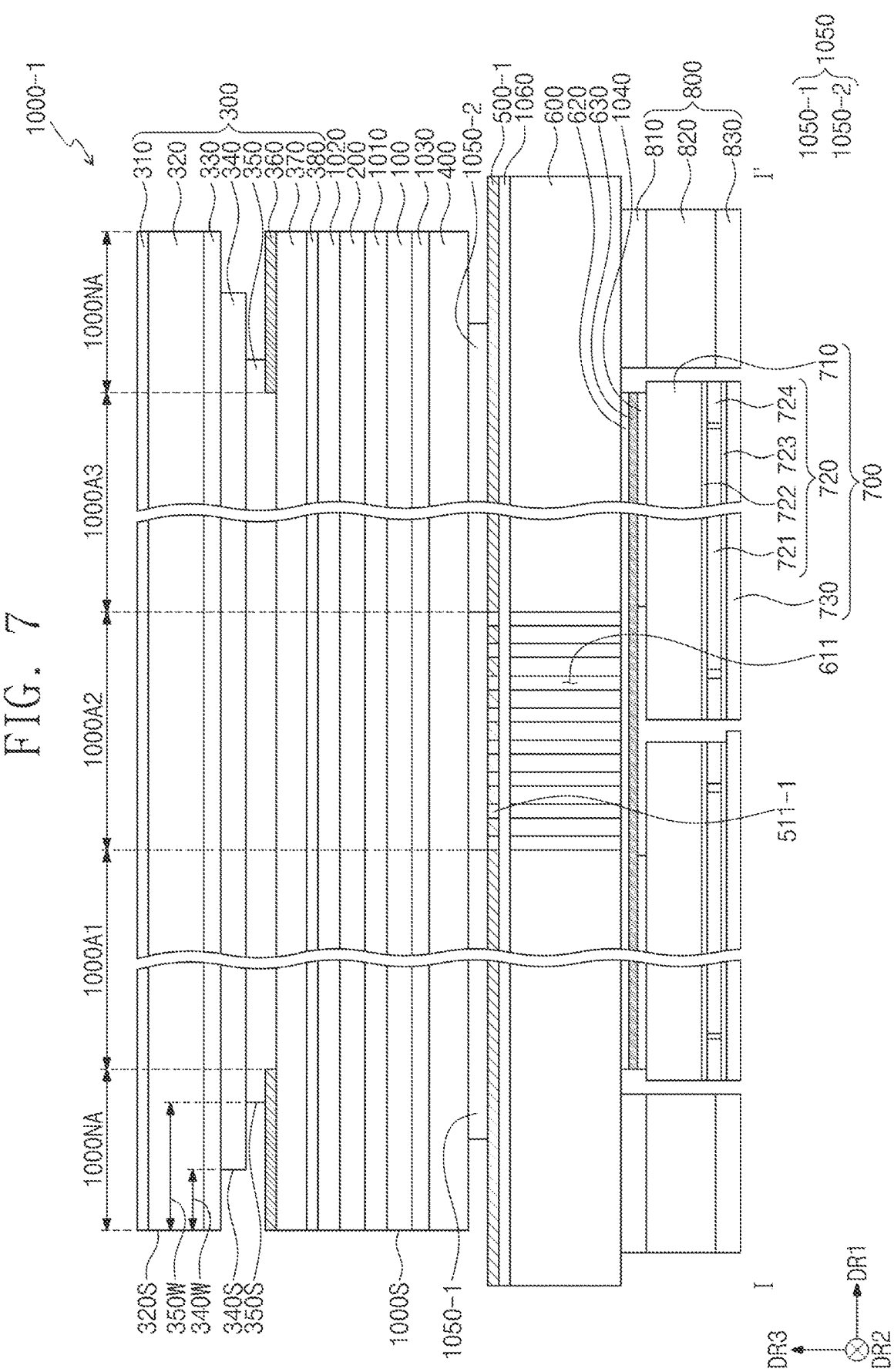
FIG. 7 is a cross-sectional view illustrating a display device according to another embodiment.

FIG. 7 is a cross-sectional view of a display device 1000-1 according to an embodiment. FIG. 7 illustrates a cross-sectional view taken along line I-I' of FIG. 1A and illustrating the display device 1000-1 according to an embodiment. Hereinafter, when a display device 1000-1 according to an embodiment is described with reference to FIG. 7, the same components as those described in FIGS. 2 to 5B are designated by the same reference symbols, and a detailed description will be omitted.

In the display device 1000-1 according to an embodiment, a light shielding layer 500-1 may be attached onto a support member 600 through a light shielding adhesive layer 1060 unlike the display device 1000 in FIG. 2. The light shielding layer 500-1 may have a light shielding sheet shape and be attached onto the support member 600 through the light shielding adhesive layer 1060. The light shielding layer 500-1 may be attached onto the support member 600 through the light shielding adhesive layer 1060. That is, the light shielding layer 500-1 may directly contact a top surface of the light shielding adhesive layer 1060, and the support member 600 may directly contact a bottom surface of the light shielding adhesive layer 1060.

The light shielding layer 500-1 may be attached onto the support member 600 through the light shielding adhesive layer 1060. The light shielding layer 500-1 may be attached to a top surface of the support member 600 through the light shielding adhesive layer 1060. The light shielding adhesive layer 1060 may include a typical adhesive or sticking agent. The light shielding adhesive layer 1060 may be disposed at the second area 1000A2 of the support member 600. Unlike as illustrated in FIG. 7, in an embodiment, the light shielding adhesive layer 1060 may not be disposed on an area overlapping a second area 1000A2 in the support member 600.

A plurality of light shielding openings 511-1 may be defined in the light shielding layer 500-1. The plurality of light shielding openings 511-1 may respectively overlap a plurality of openings 611 defined in the support member 600. The plurality of light shielding openings 511-1 defined in the light shielding layer 500-1 may entirely overlap the plurality of openings 611 defined in the support member 600.

According to one or more embodiment of the invention, as the display device 1000 including the light shielding layer 500 disposed on the support member 600 includes the first support member area AA1 in which the support member 600 does not overlap with the light shielding layer 500, the visibility of an image displayed by the display device 1000 may be improved, and the static electricity applied from outside may be further effectively removed. Thus, the reliability of the display device 1000 may be improved.

Although the embodiments of the invention have been described, it is understood that the invention should not be limited to these embodiments but various changes and modifications can be made by one ordinary skilled in the art within the spirit and scope of the invention as hereinafter claimed. Hence, the real protective scope of the invention shall be determined by the technical scope of the accompanying claims.

What is claimed is:

1. A display device comprising:
a display panel comprising a folding area and a non-folding area which is adjacent to the folding area;
a support member facing the folding area and the non-folding area of the display panel, the support member having a total planar area; and
a light shielding layer between the display panel and the support member, the light shielding layer having a total planar area,
wherein the total planar area of the light shielding layer is smaller than the total planar area of the support member.

2. The display device of claim 1, wherein the support member comprises:
a first area non-overlapping the light shielding layer; and
a second area overlapping the light shielding layer.

3. The display device of claim 2, wherein the first area of the support member is further non-overlapping the display panel.

4. The display device of claim 2, wherein
the support member has a first side extending in a first direction, a second side extending in a second direction crossing the first direction, and a corner at which the first side and the second side meet, and
the first area of the support member which is non-overlapping with the light shielding layer corresponds to the corner of the support member.

5. The display device of claim 1, wherein the light shielding layer comprises chrome carbide.

6. The display device of claim 1, wherein the light shielding layer comprises a black dye or a black pigment.

7. The display device of claim 1, wherein
the light shielding layer has a solid content having a mean particle size, and
the mean particle size is about 0.05 micrometer or less.

8. The display device of claim 1, wherein the light shielding layer is directly on the support member.

9. The display device of claim 1, further comprising a light shielding adhesive layer which is between the light shielding layer and the support member and attaches the light shielding layer and the support member to each other,
wherein the light shielding adhesive layer contacts each of the light shielding layer and the support member.

10. The display device of claim 1, wherein the support member comprises metal.

11. The display device of claim 10, wherein the support member comprises:
a non-folding plate corresponding to the non-folding area of the display panel; and
a folding plate corresponding to the folding area of the display panel and defining a plurality of openings of the support member.

12. The display device of claim 11, wherein the light shielding layer defines a plurality of light shielding openings respectively corresponding to the plurality of openings of the support member.

13. The display device of claim 1, further comprising:
a lower protection film between the light shielding layer and the display panel, and
an adhesive layer between the light shielding layer and the lower protection film and attaching the light shielding layer and the lower protection film to each other,
wherein the adhesive layer contacts each of the lower protection film and the light shielding layer.

14. The display device of claim 13, wherein
the light shielding layer has a surface adhesive force relative to the adhesive layer, and
the surface adhesive force of the light shielding layer is about 800 gram force per inch or more.

15. The display device of claim 1, wherein the light shielding layer has an arithmetic mean roughness of about 0.5 micrometer or less.

16. A display device comprising:
a display panel;
a support member facing the display panel; and
a light shielding layer between the display panel and the support member,
wherein the support member comprises:
a first area non-overlapping the light shielding layer, and
a second area overlapping the light shielding layer.

17. A method for providing a display device, the method comprising:
providing an electrostatic discharge support layer of the display device, the electrostatic discharge support layer comprising a light shielding layer on a support member, and
attaching the electrostatic discharge support layer to a display panel of the display device,
wherein the attaching of the electrostatic discharge support layer to the display panel disposes:
a first area of the support member exposed outside of the light shielding layer, and
a second area of the support member overlapping the light shielding layer.

18. The method of claim 17, wherein the providing of the electrostatic discharge support layer comprises:
providing a mask in which a first opening is defined, corresponding to the second area of the support member, and
providing a light shielding material to the second area of the support member, through the first opening of the mask.

19. The method of claim 18, wherein the mask comprises a blocking part which corresponds to the first area of the support member and blocks the light shielding material from the first area.

20. The method of claim 17, wherein
the second area of the support member comprises:
a non-folding plate, and
a folding plate which is adjacent to the non-folding plate of the support member and defines a plurality of openings of the support member,
the support member is foldable together with the display panel, at the folding plate of the support member, and
the providing of the electrostatic discharge support layer comprises providing a light shielding material to the second area of the support member except for an area corresponding to the plurality of openings in the folding plate.

* * * * *